Figures 4, 5:
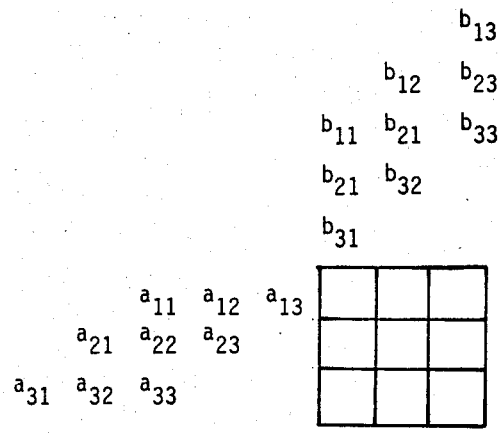

United States Patent [19]

Marwood et al.

[11] Patent Number: 4,698,807
[45] Date of Patent: Oct. 6, 1987

[54] SELF REPAIR LARGE SCALE INTEGRATED CIRCUIT

[75] Inventors: Warren Marwood, Fairview Park; Allen P. Clarke, Medindie Gardens, both of Australia

[73] Assignee: The Commonwealth of Australia, Canberra, Australia

[21] Appl. No.: 691,191

[22] PCT Filed: Apr. 9, 1984

[86] PCT No.: PCT/AU84/00053
§ 371 Date: Dec. 11, 1984
§ 102(e) Date: Dec. 11, 1984

[87] PCT Pub. No.: WO84/04225
PCT Pub. Date: Oct. 25, 1984

[30] Foreign Application Priority Data

Apr. 11, 1983 [AU] Australia ............................ PF8826

[51] Int. Cl.[4] .............................................. G06F 11/16
[52] U.S. Cl. ............................................ 371/11; 371/8
[58] Field of Search ................................ 371/7, 8, 11; 364/200 MS File, 900 MS File

[56] References Cited

U.S. PATENT DOCUMENTS

| | | | |
|---|---|---|---|
| 3,654,610 | 4/1972 | Sander | 364/900 |
| 3,665,173 | 5/1972 | Bouricius | 371/8 |
| 3,665,418 | 5/1972 | Bouricius | 364/200 |
| 4,438,494 | 3/1984 | Budde | 364/200 |
| 4,533,993 | 8/1985 | McCanny | 364/200 |

OTHER PUBLICATIONS

J. P. Coullahan, et al., "Field-Reparable Circuit Array", IBM Technical Disclosure, vol. 22, No. 4, 9/1979, pp. 1493-1494.

Kuhn et al., "Proceedings of the Sixteenth Hawaii International Conference on System Sciences 1983", published Jan. 1983, see pp. 215 to 224 Interstitial Fault Tolerance—A Technique for Making Systolic Arrays Fault Tolerant.

Computer, vol. 15, No. 1, Jan. 1982, Snyder, L., "Introduction to the Configurable Highly Parallel Computer", see pp. 47 to 56, especially p. 55.

T. T. Leighton and C. E. Leiserson, "23rd Annual Symposium on Foundations of Computer Science, Chicago, Ill., U.S.A., Nov. 3-5, 1982", published Nov. 1982, see pp. 297 to 311," Wafer Scale Integration of Systolic Arrays.

Primary Examiner—Jerry Smith
Assistant Examiner—Robert W. Beausoliel, Jr.
Attorney, Agent, or Firm—Cushman, Darby & Cushman

[57] ABSTRACT

The method of self repair of large scale integrated circuit modules (LSI or VLSI) in which a series of systolic processing elements (SPE's) arranged in rows (V and H) normal to each other, have sequential paths between elements biased so that normally the data being processed follows the vertical and horizontal rows to maintain a selected topography including the steps of establishing the functionality of each SPE, bypassing any unfunctional SPE by directing the data path of any row to a rear SPE in the nest row, and directing the data path from the said near SPE back to the original row to maintain the original topography.

9 Claims, 12 Drawing Figures

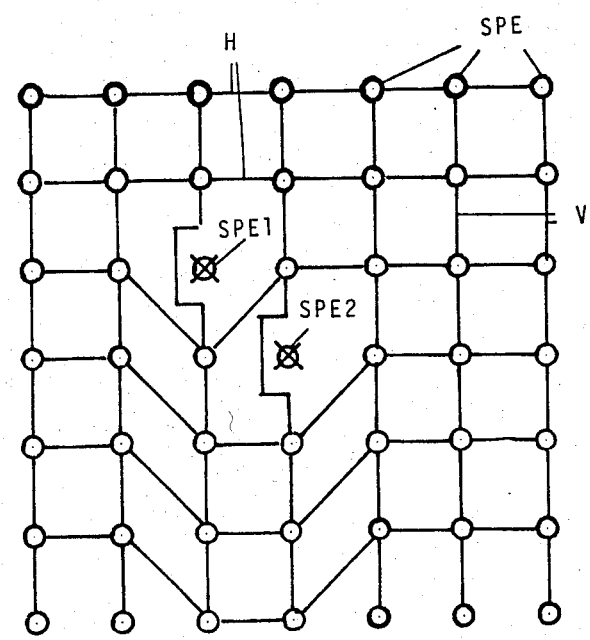
FIG. 1
LINEAR ARRAY [N ELEMENTS] → BEAM FORMER → DISPLAY
FIG. 2
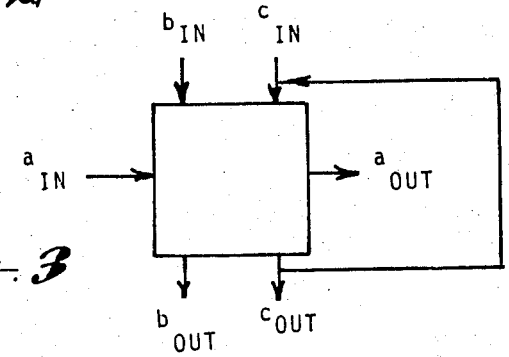
FIG. 3

| INPUT PROCESSOR | PRIORITY | PROCESSOR | PRIORITY | OUTPUT PROCESSOR |
|---|---|---|---|---|
| p-1, q-1 | 2 |  | 0 | p-1, q+1 |
| p, q-1 | 1 | pq | 1 | p, q+1 |
| p+1, q-1 | 0 |  | 2 | p+1, q-1 |

— NON REDUNDANT
—·— RELIABILITY STRUCTURE 6(a)
---- RELIABILITY STRUCTURE 6(b) 6(c)

SELF REPAIR LARGE SCALE INTEGRATED CIRCUIT

INTRODUCTION

The sonar signal processing task is characterised by high input/output data rates together with desired computational loads which exceed the capacity of currently available main-frame computers. Adaptive algorithms for various tasks such as beam-forming, filtering, display enhancement, etc. are widely discussed in the journal literature such as the journal of the Acoustical Society of America. These are needed in a real-world environment as they have the potential to significantly enhance the performance of sonar systems in terms of target detection and tracking. However, they increase the computing load by orders of magnitude. Hard wired implementations of some processors with abilities to go some way towards meeting the desired computing load, are constrained in size by a lack of space on the mobile platforms on which they are installed.

The necessary consequence of these conflicting requirements is the matching of software algorithms to efficient hardware realisations. In the past this has implied dedicated hardware as mentioned above. Such hardware is not easily reconfigurable in the event of a fault. Failure in part of the system implies the manual replacement of that part. The necessary operator intervention both for fault diagnosis and part replacement is unacceptable in todays environment.

Current work in the area of high performance, special-purpose computer systems indicates that future sonar processors will have systolic architectures. Software will be implemented on multidimensional VLSI arrays of systolic processing elements (SPE's) where each element is connected to its nearest neighbours only. Descriptions of such architectures, together with applications and performance, have been given by a numer of authors including (1) Kung H. T., "Why systolic architectures?", COMPUTER, 15, 1, January, 1982, (2) Whitehouse H. J. and Speiser J. M., "Sonar applications of systolic array technology", IEEE EASCON, Washington, D.C., November, 1981, (3) Mead C. A. and Conway L. A., "Introduction to VLSI systems", Addison-Wesley, Reading, Mass., 1980, (4) Snyder L., "Introduction to the configurable, highly parallel computer", COMPUTER, 15, 1, January, 1982, and (5) Bertram J. F., Ramseyer R. R. and Heins J. M., "Fifth generation digital sonar signal processing", IEEE Journal of Oceanic Engineering, October, 1977.

Consideration of the advantages of this approach to the sonar signal processing problem leads to a necessary consideration of the implications for system reliability. As noted by Snyder L., "Introduction to the configurable, highly parallel computer", COMPUTER, 15, 1, January, 1982, the implementation of a configurable systolic array processor (SAP) leads to a fault tolerant architecture.

In this specification consideration is given to a particular systolic configurable array processor (SCAP) which in the application environment allows the processor to possess a limited self-repair characteristic which does not require operator intervention or downtime in the event of a failure in one or more of its elements. A tentative analysis of the system fault tolerance is provided. For less critical applications it is noted that such an architecture can effectively increase the yield percentage in the production of VLSI dice.

THE INVENTION

The system of this invention generally comprises a module having a series of elements arranged in rows normal to each other with the sequential paths between elements biased in such a way that normally the data being processed follows the vertical and horizontal rows but should one of the elements be unfunctional either through breakdown of the element or the elements being busy, a secondary path is established to an available element in the next row and from this back to follow the row of the initial element through the chip.

A method of this invention comprises a series of systolic processing elements (SPE's) arranged in rows normal to each other, have sequential paths between elements biased so that normally the data being processed follows the vertical and horizontal rows to maintain a selected topography, characterised by the steps of; establishing the functionality of each SPE, bypassing any unfunctional SPE by directing the data path of any row to a near SPE in the next row, and directing the data path from the said near SPE back to the original row to maintain the original topography.

The processor comprises an LSI or VLSI in which a series of systolic processing elements (SPE's) are arranged to arrays rows normal to each other and have sequential paths between elements biased so that normally the data being procesed follows the vertical and horizontal rows to maintain a selected topography, characterised by; means to detect a monfunctional SPE in a selected row, and means to divert the data path around the nonfunctioning SPE by diverting the data path to a functional SPE in the next row adjacent to the nonfunctioning SPE and back to the next SPE in the said selected row whereby to maintain the original topography.

THE DRAWINGS

Figure 6:
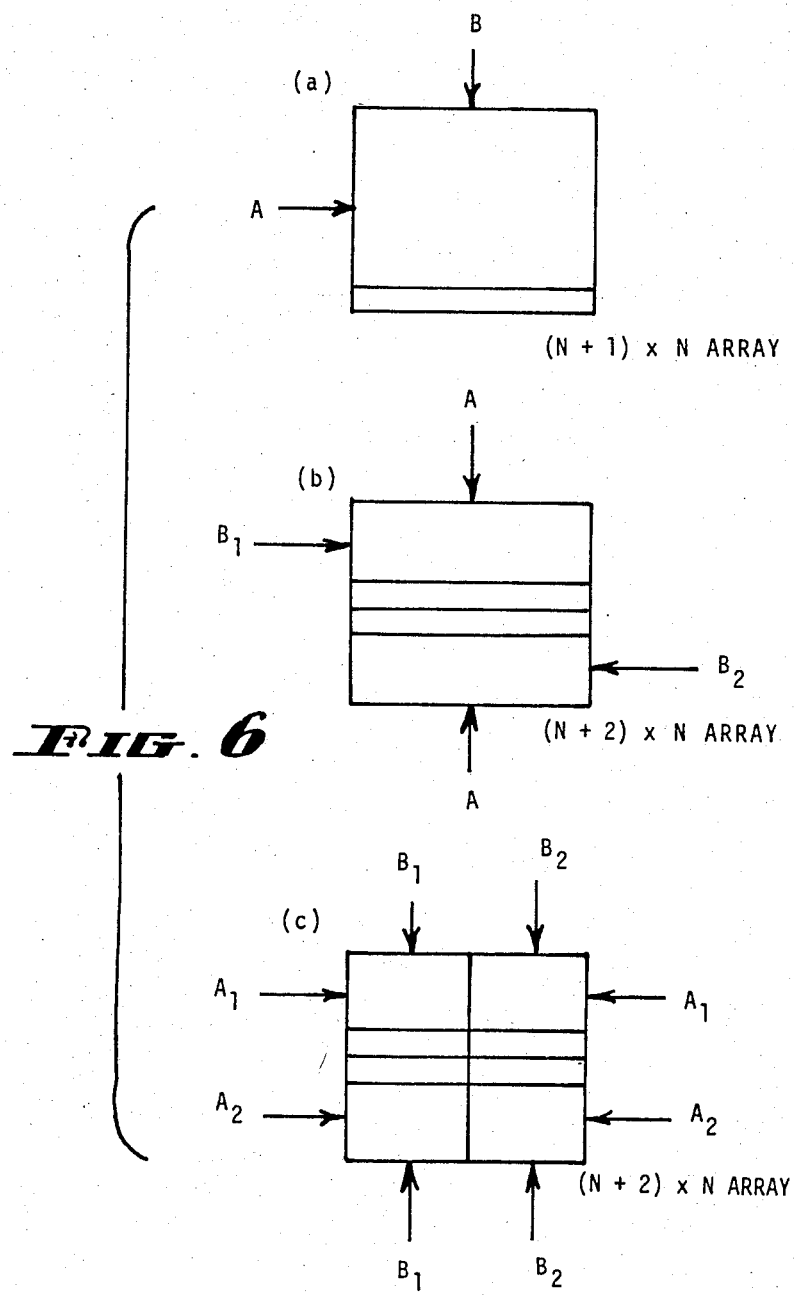
Figure 7:
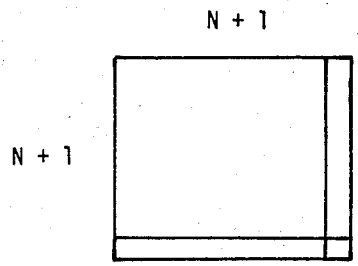
Figure 8:
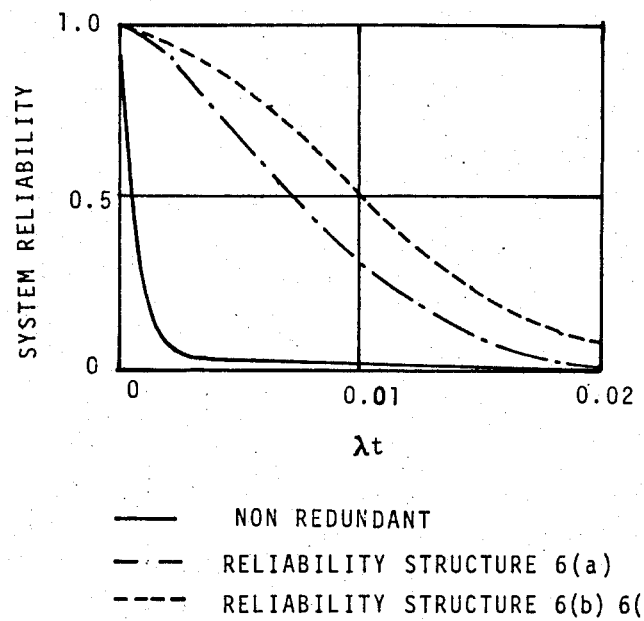
Figure 9:
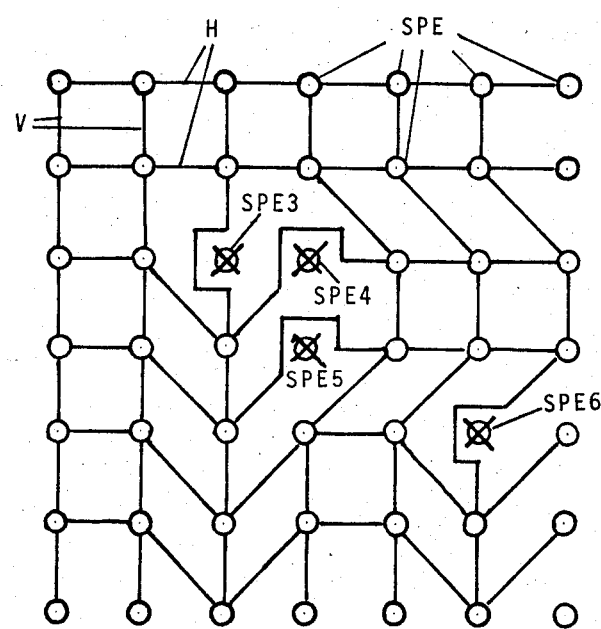
Figure 12:
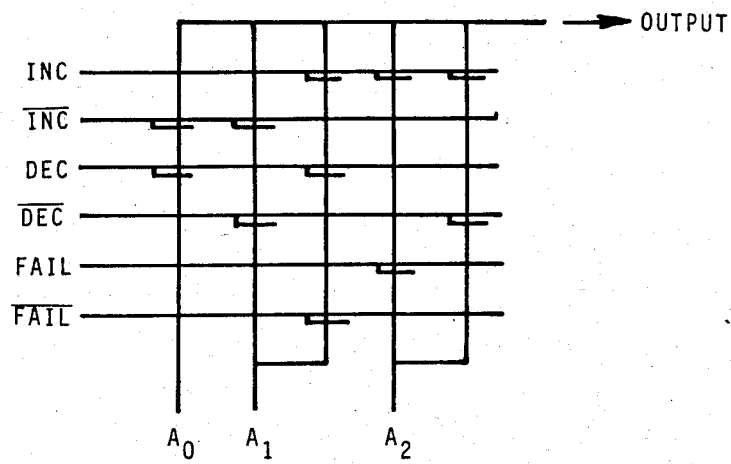
Figure 10:
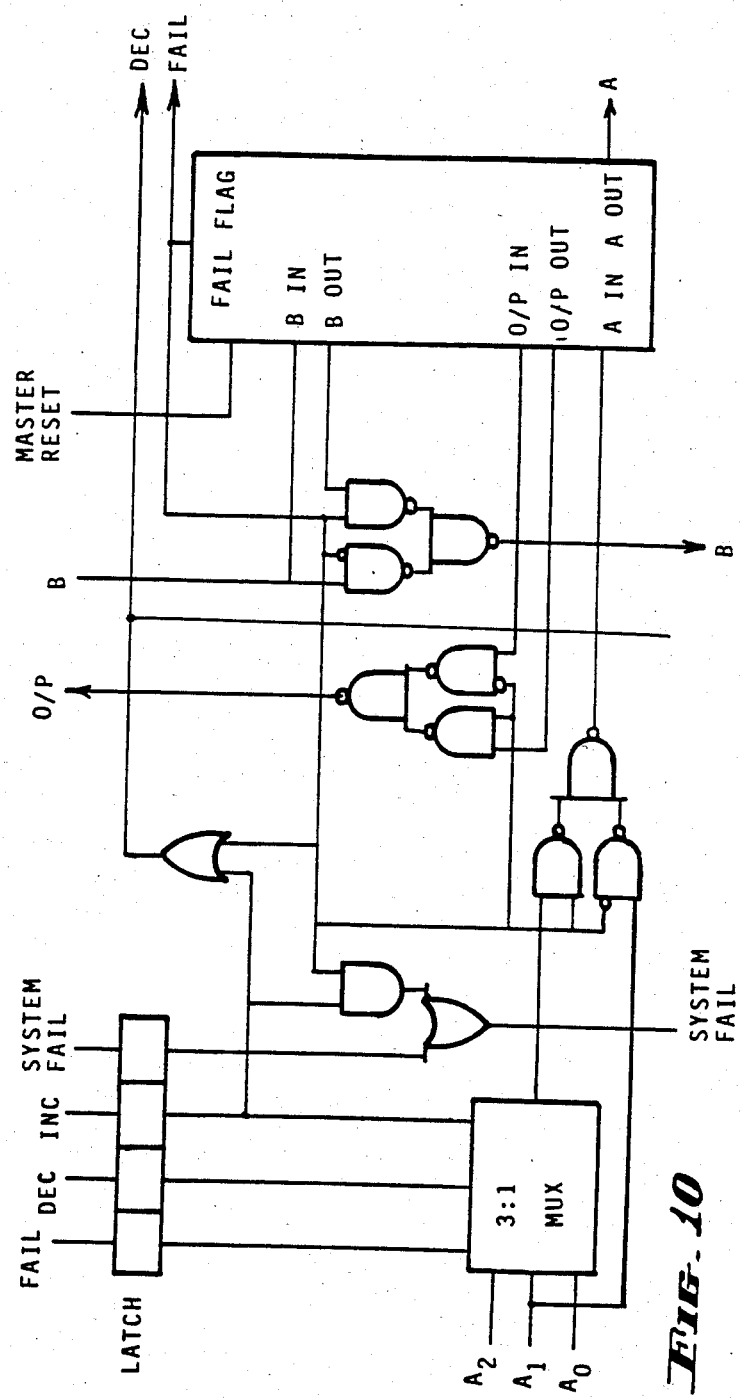
Figure 11:
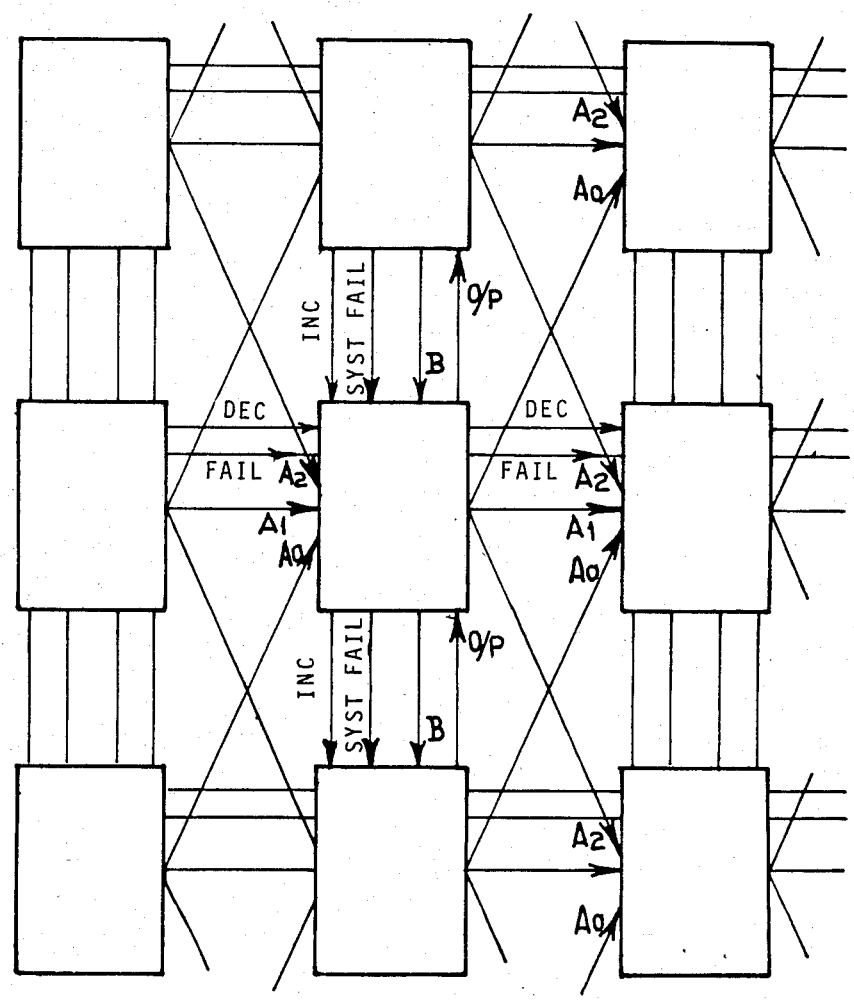

FIG. 1 is a schematic view indicating a module in which rows of elements in which two elements are inoperative and in which the changed flow paths are illustrated, FIG. 2 represents a basic sonar system, FIG. 3 shows an inner product accumulation element, FIG. 4 shows how Matrix-Matrix multiplication occurs, FIG. 5 is a table showing processors, priority and row data paths associated with the $pq^{th}$ SPE, FIG. 6 shows partitioned systolic arrays for increased speed and reliability, (a) showing an $(N+1) \times N$ array (b) showing an $(N+2) \times N$ array, and (c) showing a further $(N+2) \times N$ array, FIG. 7 shows an array with two dimensional redundancy, FIG. 8 shows a graphical comparison of system reliability for a $32 \times 32$ element array showing in the full line graph of a nonredundant condition, in chain line a reliability structure of FIG. 6 (a) and in dotted lines a reliability structure for FIGS. 6(b) and 6(c), FIG. 9 corresponds to FIG. 1 but shows a two dimensional redundancy, FIG. 10 shows a systolic processing element with data path switching and control detailed, FIG. 11 shows control and data path interconnections between systolic processing elements, and FIG. 12 shows, in "stick" notation, an NMOS VLSI implementation of the multiplexer where the "don't cares" have been assigned to minimise gating logic.

Referring first to FIG. 1 of the drawings, horizontal rows H and vertical rows V are shown, each containing at the intersections of the rows systolic processing elements SPE, which rows include two nonfunctioning elements SPE1 and SPE2 showing the flow-paths established by the algorithm through biasing of the paths, the signal fed into the paths including a test signal which detects an unworkable or busy element in the particular row and then causes diversion to the next workable element and back again to the row without destroying the terminal sequence of the paths. The lower SPE's are redundant so far as a normal horizontal row array is concerned.

Because there can be a number of redundant elements in such a system it will be realised that whereas replacement of the chip or the element would otherwise be necessary, the present invention allows the function of the chip to continue using alternate elements available for the processing procedure.

A SONAR SIGNAL-PROCESSING SYSTEM

Consider the basic sonar system given broadly in FIG. 2.

The computationally intensive component in this system is the beamformer. Let $$f_{pq} = \exp(-i2\pi pq/N) \tag{1}$$

describe an $N \times N$ matrix F of Fourier coefficients.

If N sensor array samples in row order define an $N \times N$ matrix A, then FA is a matrix whose columns are the Discrete Fourier Transforms (DFT) of each sensor output. The matrix FAF is then the two dimensional DFT of A and performs the beamforming function. A beamformer can then be implemented by an architecture which executes full matrix multiplication.

IMPLEMENTATION

Whitehouse and Speiser, referred to earlier, describe an SAP consisting of elements which perform inplace inner product accumulation as shown in FIG. 3.

Data flow for a matrix-matrix multiplication executed in this processor is shown in FIG. 4. The computation is completed in 3N-2 cycles, and pipelining can achieve near to complete utilisation.

A SYSTOLIC CONFIGURABLE ARRAY PROCESSOR

Failure of any processing element in the processor as so far discussed results in failure of the system. However a structure can be considered which allows reliability to be attained through SPE redundancy. A systolic architecture can be defined in terms of the data paths between processors.

$\{d_{ij} d_{i+1,j}: i=1, \ldots, N-1: j=1, \ldots, N\}$ defines the vertical paths $\{d_{ij} d_{i,j+1}: i=1, \ldots, N: j=1, \ldots, N-1\}$ defines the horizontal paths in the above architecture. Independent buses can be implemented on any path for the transfer of both input and output data.

For redundancy this basic structure can be expanded with additional initially redundant paths defined by $\{d_{ij} d_{i+r, j+1}: i=1, \ldots, (n-r): j=1, \ldots, (N-1): r=1, \ldots, k\}$ $\{d_{ij} d_{i-r, j+1}: i=(r-1), \ldots, N: j=1, \ldots, (N-1): r=1, \ldots, k\}$ and $\{d_{ij} d_{i+2, j}: i=1, \ldots, (N-2): j=1, \ldots, N\}$ These paths allow k redundant SPE's to be included in each column. The failure of up to k SPE's then causes system errors only until a fault detection and data path reconfiguration process has been completed. Failed SPE's are bypassed in such a way as to retain the original topology, and no throughput degradation is incurred. Implementation difficulties limit the maximum number of redundant elements which may be incorporated in this way. As k increases, circuit complexity in the data paths increases and can exceed the complexity of the SPE. To ensure that data path reliability is much greater than SPE reliability, we therefore consider an implementation with the minimum possible redundancy of one. For correct system operation it is necessary to define data path selection procedures which enable each SPE to transfer data and results to a correctly functioning adjacent SPE. It is shown later than SPE functionality can be flagged by the element itself.

Possible row data paths for the $pq^{th}$ SPE are detailed in the table, of FIG. 5.

The input data path is determined by the $pq^{th}$ SPE sending an acknowledgement to a request for service from the highest priority requesting processor, and a "busy" signal to the remaining two processors. The output data path is that which is directed to the lowest priority available output processor. Data paths from edge array elements $\{d_{1j} d_{0, j+1}\}$, $\{d_{N, j} d_{N, j+1}\}$ are directed out of the array and are hardware intialised to return "busy" signals. These paths force the correct initial structure. Failure of the $pq^{th}$ SPE causes "busy" signals to be returned to all input processors. The data path $d_{p-1, q} d_{p+1, q}$ is then activated to by-pass the column element.

If no output data path is available to the $pq^{th}$ element due to SPE failures, that element also "fails". This dynamic structure is capable of both bypassing a failed SPE and also restoring the SPE to the active structure if functionality is regained.

FAULT DETECTION IN A SCAP

An implementation methodology for online performance monitoring and fault detection and location for modular sonar signal processors is briefly discussed in Bartram, J. F., Ramseyer R. R. and Heines J. M., referred to earlier herein. A supervisory element which controls the functioning of any module also executes regular diagnostic algorithms on the modules and reports to the system controller. An equivalent diagnostic technique can be considered for a cellular array of SPE's.

If each SPE is designed with a diagnostic mode where it flags the result of a comparison of a reference value with an inner product accumulation, the functionality of each array element can be tested. The matrix product $$A B = C \tag{2}$$

where $a_{ij}=0$, $j>2$ and $b_{ij}=0$, $i>2$, is complete in two pipelined cycles. The accumulated inner product terms $c_{ij}$ of the resultant matrix, if correct, demonstrate the correct functioning of both data paths and SPE's. If a diagnostic mode bit is added to each of the data paths in one dimension, a complete diagnostic algorithm can propagate through the array in a systolic manner. If performed after every full matrix multiplication, performance is degraded by only $(2/N) \times 100\%$. The use of augmented matrices enables redundant elements to be tested also. The failure of any SPE will then be notified to the supervisor by the failure of the row of redundant elements to accept data. The failure of two rows indicate system failure.

RELIABILITY ANALYSIS

Consider an $m \times n$ array of SPE's with $m > n$. The active elements initially form an $n \times n$ matrix with $m-n$ rows of "hot" spares. All elements are assumed independent. The time to failure, $t_f$, of each element is a sample from an exponential distribution. i.e.

$$f(t_f) = \lambda \exp(-\lambda t_f) \quad (3)$$

is the failure time density distribution and $$F(t_f) = 1 - \exp(-\lambda t_f) \quad (4)$$

is the failure time distribution function, where $t_f > 0$.

The probability that an element will be functioning at time t is defined as the reliability, $r(t)$ i.e. $r(t) = P[t_f > t] \quad (5)$
$= 1 - F(t)$
$= \exp(-\lambda t)$ A column will fail, and will cause the system to fail when only $n-1$ elements remain active in it. The probability that exactly n elements remain in an $m \times 1$ column at time t is binomially distributed and is given by $$P_n(t) = \begin{bmatrix} m \\ n \end{bmatrix} r(t)^n (1 - r(t))^{m-n} \quad (6)$$

The probability of failure of one of the remaining n independent elements in the time interval $(t, t+dt)$ is $$P_1(dt) = n\lambda dt \quad (7)$$

Thus the probability for column failure in this interval is $$P_f = P_n(t) P_1(dt) \quad (8)$$

$$= \begin{bmatrix} m \\ n \end{bmatrix} r(t)^n (1 - r(t))^{m-n} n\lambda dt$$

and the column failure density function is $$p(t) = n\lambda \begin{bmatrix} m \\ n \end{bmatrix} r(t)^n (1 - r(t))^{m-n} \quad (9)$$

$$= n \begin{bmatrix} m \\ n \end{bmatrix} r(t)^{n-1} (1 - r(t))^{m-n} \left(-\frac{dr(t)}{dt}\right)$$

Expressed as a function of $r(t)$, $$p(r) = n \begin{bmatrix} m \\ n \end{bmatrix} r^{n-1} (1 - r)^{m-n} \quad (10)$$

The probability that a column has not failed at time t is its reliability $R(t)$, i.e.

$$P[t_f > t] = R(t) \int_t^\infty p(t') dt' \quad (11)$$

$$= - \int_{r(t)}^{0} p(r) dr$$

$$= \int_0^{r(t)} p(r) dr$$

Substituting $a = n$ and $b - 1 = m - n$ $$R(t) = \frac{(a + b - 1)!}{(a - 1)!(b - 1)!} \int_0^{r(t)} r^{a-1}(1 - r)^{b-1} dr \quad (12)$$

Using Luke (7), 8.2.3 equations (1) and (3), $$R(t) = \frac{(a + b - 1)!}{a!(b - 1)!} r^a (1 - r)^b {}_2F_1(1, a + b; a + 1; r) \quad (13)$$

Where ${}_2F_1(.,.;.;.)$ is the usual Gauss Hypergeometric function. For the minimum redundancy condition of one element, $$R_n(t) = (n+1) r^n (1-r)^2 {}_2F_1(1, n+2; n+1; r) \quad (14)$$

The reliability of n columns and hence the system reliability is then $$R_n^n(t) = (R_n(t))^n \quad (15)$$

INCREASED RELIABILITY STRUCTURES

The system reliability defined by equation (15) can be improved. Accepting the limitation of one redundant element per column, we now examine ways in which the task can be decomposed to allow an increased system redundancy.

Consider the product of two matrices of even order n. There is no loss of generality of the restriction to even order as an odd order matrix can be augmented with zeroes to satisfy this requirement. FIG. 4(a) shows the implementaton of this multiplication on the cellular array with one redundant element per column. The non-pipelined execution time for this structure is $3n - 2$ cycles.

Whitehouse defines the non-pipelined execution time of non square arrays in terms of a $J \times N$ and $N \times K$ matrix product. The execution time is $N + J + K - 2$ cycles on a cellular array of dimensions $J \times k$.

Partitioning the matrices in equation (2) gives $$[A][B_1 B_2] = [C_1 C_2] \quad (16)$$

The two partitioned matrix products $C_1$ and $C_2$ can be computed in parallel on two $N/2 \times N$ cellular arrays, each computing the product of an $N \times N$ with an $N \times N/2$ matrix. Computation time is reduced to $5N/2 - 2$ cycles and it is clear that a restructuring of the array in 6(a) allows a doubling of the percentage of redundant SPE's. The restructured array is shown in FIG. 6(b).

System reliability is given by $$R_s(t) = R_{N/2}^{2N}(t) \qquad (17)$$

A further partitioning gives $$\left[\begin{array}{c} A_1 \\ \hline A_2 \end{array}\right] [B_1 \mid B_2] = \left[\begin{array}{c|c} C_{11} & C_{12} \\ \hline C_{21} & C_{22} \end{array}\right] \qquad (18)$$

Implementation of this partitioning is shown in FIG. 6(c). Execution time is again reduced and is 2N−2 cycles. Redundancy and reliability are identical to that of 6(b), but the time to detect fault conditions is minimised.

TWO-DIMENSIONAL REDUNDANCY

So far the implementation of a one dimensional redundancy philosophy to a particular data path architecture has been discussed. Increasing the formal data paths in this architecture with $\{d_{ij}\ d_{i,j+2}: i=1,\ldots, n;\ j=1,\ldots, (n-2)\}$ allows the introduction of redundancy in two dimensions as shown in FIGS. 7, 8 and 9. Analysis and discussion of this structure is not included but it is noted that the partitioning of (18) results in a structure with the highest percentage redundancy, the highest reliability and the fastest non-pipelined computation time.

In FIG. 9 four nonfunctional SPE's, SPE3 to SPE6 and the left hand SPE's at the module edge are redundant so far as a vertical row array function is concerned.

FIG. 8 compares the reliabilities of the implementations given in FIGS. 6(a), (b) and (c) on a 32×32 element primary array with a nonredundant system. The ability of these architectures to operate with no performance degration has significant implications for the production of future VLSI dice. Production costs can be minimised by allowing production faults to be present, but made transparent to the user by self configurable architectures.

AN IMPLEMENTATION

FIG. 10 shows a systolic processing element. The data lines allow the element to perform a multiply-accumulate function on coefficients which are passed through orthogonal rows and columns of such elements. FIG. 2 shows the interconnection of data and control paths for a particular element in an array. The control signals involve fewer protocols than are required in the general case, but allow a high density VLSI implementation.

Initialisation of data paths and control signals is by a master reset line which sets the state of all elements to "failed". In this state every element accepts data from the A1 data input. Activation of a test mode by an instruction associated with the input data then determines the functionality of the element and sets the "fail" flag. All control signals are updated only at the completion of the test phase and are transmitted only to adjacent elements. The functional data paths used by subsequent operations are established by the propagation of this test mode across and down the array. Selection of the input data path is by a multiplexer controlled by combinatorial logic. Inputs to the combinatorial logic circuit are obtained directly from the status outputs of the elements directly above and to the left of the element. Neglecting the reset condition, the truth table for the input data path multiplexer is as follows;

| CONTROL INPUTS | | | I/P DATA PATH |
|---|---|---|---|
| DEC | INC | FAIL | SELECT |
| 0 | 0 | 0 | A1 |
| 1 | 0 | 0 | A0 |
| 0 | 1 | 0 | A2 |
| 1 | 1 | 0 | A1 |
| 0 | 0 | 1 | x |
| 1 | 0 | 1 | A0 |
| 0 | 1 | 1 | x |
| 1 | 1 | 1 | A2 | where x indicates a "don't care".

"System fail" is a flag which propagates to the edge of the array if more than one element in a column fails. This is a condition which can not be resolved with only one redundant element, and the system will have failed.

Once established by a test mode, the data paths remain stable until an element failure is detected by a subsequent test mode. A reconfiguration of the active paths then occurs to restore system functionality. Horizontal data paths are biased to bypass a failed element and elements in the vertical path force data to bypass them if they are in the "failed" state. Recovery of an element is possible as data is still available to the failed element for it to perform all subsequent tests. A successful test will clear the "fail" flag and cause a restoration of the data paths. This feature of the implementation allows recovery from "soft" errors which do not recur when another test is made.

We claim:

1. A method of self repair of large scale integrated circuit modules (LSI or VLSI) comprising the steps of:
    arranging a set of systolic processing elements, SPE's, in rows orthogonal to each other,
    forming sequential paths between SPEs biased so that normally a data path of the data being processed follows the rows,
    establishing which, among the SPE's of a row, are non-functioning SPE's by causing each non-functioning SPE to be flagged by the SPE itself as a result of a comparison of a reference value with an SPE result,
    bypassing any such non-functonal SPE by directing the data path from such SPE by triggering diversion of the data to a near SPE in another row, and
    directing the data path from said near SPE back toward the original row to establish and maintain the desired path betwee functional SPE's.

2. The method of claim 1 in which the circuit has rows of initially redundant SPE's to increase the number of replacement SPE'S available for a selected number of usable rows.

3. The method of claim 1 in which the circuit includes edge rows along edges thereof, and a busy signal is entered into SPE's in any edge row to divert the data along the edge row and to indicate non-functioning of an SPE in the edge row.

4. A self repair large scale integrated circuit module comprising:
    a set of systolic processing elements or SPE's, arranged as arrays of rows orthogonal to each other and in which sequential paths are formed between SPE's, and are biased so that normally the data being processed follows the rows to maintain a data path along selected rows, means for detecting non-functional SPE's of each row and for flagging the non-functioning SPE's, and rearrangement means, for detecting at least one non-functoning SPE in a selected row and diverting the data path around the non-functioning SPE by diverting the data path to a functional SPE in another row and back toward a next SPE in said selected row to establish and maintain the desired interconnection path between functional SPE's.

5. A self repair large scale integrated circuit module according to claim 7 in which the said large scale integrated circuit has at least a redundant row of SPE's to increase the number of SPE's available for replacement of non-functional SPE's.

6. A self repair large scale circuit module such as an LSI or a VLSI comprising:
a series of systolic processing elements, SPE's, arranged in arrays of rows orthogonal to each other,
paths between elements biased so that normally the data being processed follows the rows to maintain a selected topography,
at least an extra row of SPE's having a dimensional path connecting the extra SPE's to each other and to the SPE's of other rows,
means, coupled to the SPE's, to inject a test signal which detects a non-functional SPE in a selected row and flags the non-functioning SPE,
each SPE including means for diverting said path around the said non-functioning SPE through an SPE in another row,
said diversion being effected from a first functional SPE adjacent said nonfunctioning SPE, to a second functional SPE adjacent the non-functional SPE and on an opposite side thereof compared with said first functional SPE to maintain the originl row path.

7. A self repair large scale integrated circuit module according to claim 6 in which the series includes edge rows along edges thereof, and further comprising means at the edge rows of SPE's to initiate a busy operator signal and direct the data path along a side edge row.

8. The method of self repair of large scale integrated circuit modules comprising the steps of:

arranging a set of systolic processing elements in rows orthogonal to each other, forming sequential paths between elements, biased so that normally the data being processed follows the rows, establishing non-functioning SPE's of each row by causing each non-functioning SPE to be flagged by the SPE itself, as a result of a comparison of a reference value with an SPE result, bypassing any such non-functional SPE by causing a non-functioning SPE in a first row, to direct the data path from the non-functioning SPE by triggering diversion of the data to a receiving SPE in at least a next row adjacent to the non-functioning SPE, and directing the data path from said receiving SPE back to an SPE in said first row where functional SPE's allow this to establish and maintain, where possible, exit paths from said module in relation to entry paths from said module.

9. A self repair large scale integrated circuit module (LSI or VLSI) comprising:
a set of systolic processing elements (SPE's) arranged in rows orthogonal to each other,
a plurality of data transmission paths between elements,
means for selecting the data transmission paths so that data being processed will normally follow the rows,
means, in each SPE, for flagging non-functioning SPE's of each row as a result of a comparison of a reference value with an SPE result,
said data transmission paths being biased so that any such non-functioning SPE in a first row directs the data paths from the non-functioning SPE to trigger diversion of the data to a receiving SPE in at least a next row adjacent to the non-functioning SPE, and
means to direct the data path from said receiving SPE back to an SPE in said first row where functional SPE's allow this to establish and maintain, where possible, the exit paths in relation to the entry paths.

* * * * *